United States Patent
Kamimura et al.

(10) Patent No.: US 6,650,611 B1
(45) Date of Patent: Nov. 18, 2003

(54) MASTER DISC MANUFACTURING APPARATUS

(75) Inventors: Kenji Kamimura, Koufu (JP); Kazumi Kuriyama, Koufu (JP); Osamu Kumasaka, Koufu (JP); Hiroki Kaneda, Koufu (JP); Masami Sone, Koufu (JP); Takeharu Iwata, Koufu (JP); Masaki Kobayashi, Koufu (JP)

(73) Assignee: Pioneer Corporation, Tokyo (JP)

( * ) Notice: Subject to any disclaimer, the term of this patent is extended or adjusted under 35 U.S.C. 154(b) by 230 days.

(21) Appl. No.: 09/950,015

(22) Filed: Sep. 12, 2001

(30) Foreign Application Priority Data

Sep. 14, 2000 (JP) .......................................... 2000-280305
Jul. 26, 2001 (JP) .......................................... 2001-226300

(51) Int. Cl.$^7$ ................................................ G11B 7/00
(52) U.S. Cl. ...................... 369/101; 369/126; 369/44.27
(58) Field of Search ................................ 369/101, 126, 369/112.01, 44.27, 44.28, 47.1, 53.1

(56) References Cited

U.S. PATENT DOCUMENTS 5,453,970 A * 9/1995 Rust et al. ................... 369/126
6,307,826 B1 * 10/2001 Katsumura et al. ......... 369/101
6,377,414 B1 * 4/2002 Wang ....................... 369/13.14

* cited by examiner

Primary Examiner—Muhammad Edun
(74) Attorney, Agent, or Firm—McGinn & Gibb, PLLC (57) ABSTRACT

An apparatus of manufacturing a master by irradiating an electron beam on a substrate mounted on a turntable includes a rotation drive section for rotating the turntable; first and second correction-signal generating sections for respectively detecting first and second asynchronous components of rotational fluctuation of the turntable in a predetermined direction and in a direction perpendicular to the predetermined direction to generate first and second correction signals; and a deflection control section for controlling the electron beam deflection on the basis of the first and second correction signals.

7 Claims, 8 Drawing Sheets

MASTER DISC MANUFACTURING APPARATUS

BACKGROUND OF THE INVENTION

1. Field of the Invention

The present invention relates to a manufacturing apparatus of a master disc by irradiating an electron beam on a substrate.

2. Description of the Related Art

A variety of large-capacity recording media are under development for recording image/audio data and digital data thereon. An optical disc such as a DVD (Digital Versatile Disc) is one example of the recording media. Research and development are now under progress for increasing the recording capacity to, for example, 30 GB (Giga-Bytes) for the optical disc having a diameter of 12 cm. Also, a hard disk platter for magnetic recording having large capacity is also under development.

Recording resolution, however, is limited by the spot diameter of a laser beam for recording in the manufacturing process of a master (i.e., a master disc or a stamper) of a recording medium using a conventional laser beam in a visible or ultraviolet wavelength range. Investigations have been made for manufacturing the master (i.e., cutting of the master) with a master manufacturing apparatus using an electron beam for increasing the recording density of the disc, since the electron beam has a smaller spot diameter than a visible or ultraviolet laser beam.

Such a high-density disc, for example, the DVD has a very fine track pitch of 1 μm or less. Further improving the density requires that the track pitch be made smaller. This demands not only high precision control on an electron beam but also a high precision operation of a drive unit which rotates and moves a substrate for the master disc. Particularly, it is necessary to perform high precision control on the rotational fluctuation or the like that is produced in such a drive unit. However, a practical master manufacturing apparatus capable of preparing high-precision masters has not appeared yet.

OBJECT AND SUMMARY OF THE INVENTION

The present invention has been made in view of the problems mentioned above, and the object of the present invention is to provide a high precision master manufacturing apparatus which is capable of manufacturing a high-density disc.

To achieve the object, according to one aspect of the present invention, there is provided an apparatus for manufacturing a master by irradiation of an electron beam on a substrate mounted on a turntable, which comprises an electron-beam emitting section for emitting the electron beam; a focus control section for converging the electron beam on a principal surface of the substrate; a rotation drive section for rotating the turntable; a movement drive section for relatively moving the electron-beam emitting section and the turntable in a predetermined direction in a plane parallel to the principal surface; a first correction-signal generating section for detecting a first asynchronous component of rotational fluctuation of the turntable in the predetermined direction to generate a first correction signal; a second correction-signal generating section for detecting a second asynchronous component of rotational fluctuation of the turntable in a direction perpendicular to the predetermined direction to generate a second correction signal; and a deflection control section for performing deflection control on the electron beam on the basis of the first correction signal and the second correction signal.

According to another aspect of the present invention, there is provided an apparatus for manufacturing a master by irradiation of an electron beam on a substrate, which comprises an electron-beam emitting section for emitting the electron beam; a deflection drive section for performing deflection control on the electron beam; a rotation drive section for rotating the substrate; a movement drive section for relatively moving the electron-beam emitting section and the substrate in a predetermined direction in a plane parallel to a principal surface of the substrate; a distance measuring section for measuring an displacement amount of the substrate in the predetermined direction when the substrate is rotated; an asynchronous-component generating section for calculating a weighted mean value of a current displacement amount measured by the distance measuring section and an accumulated displacement amount and for subtracting the calculated weighted mean value from the measured current displacement amount to generate an asynchronous component, the accumulated displacement amount being a previous weighted mean value for one rotation of the substrate; and a control section for controlling the deflection drive section based on a magnitude of the asynchronous component to thereby adjust an irradiation position of the electron beam.

DETAILED DESCRIPTION OF THE EMBODIMENTS

Preferred embodiments of the present invention will hereinafter be described in detail with reference to the accompanying drawings. The substantially same constitute elements are denoted with the same reference numerals in the drawings and throughout the following description of the embodiments.

First Embodiment

Figure 1:
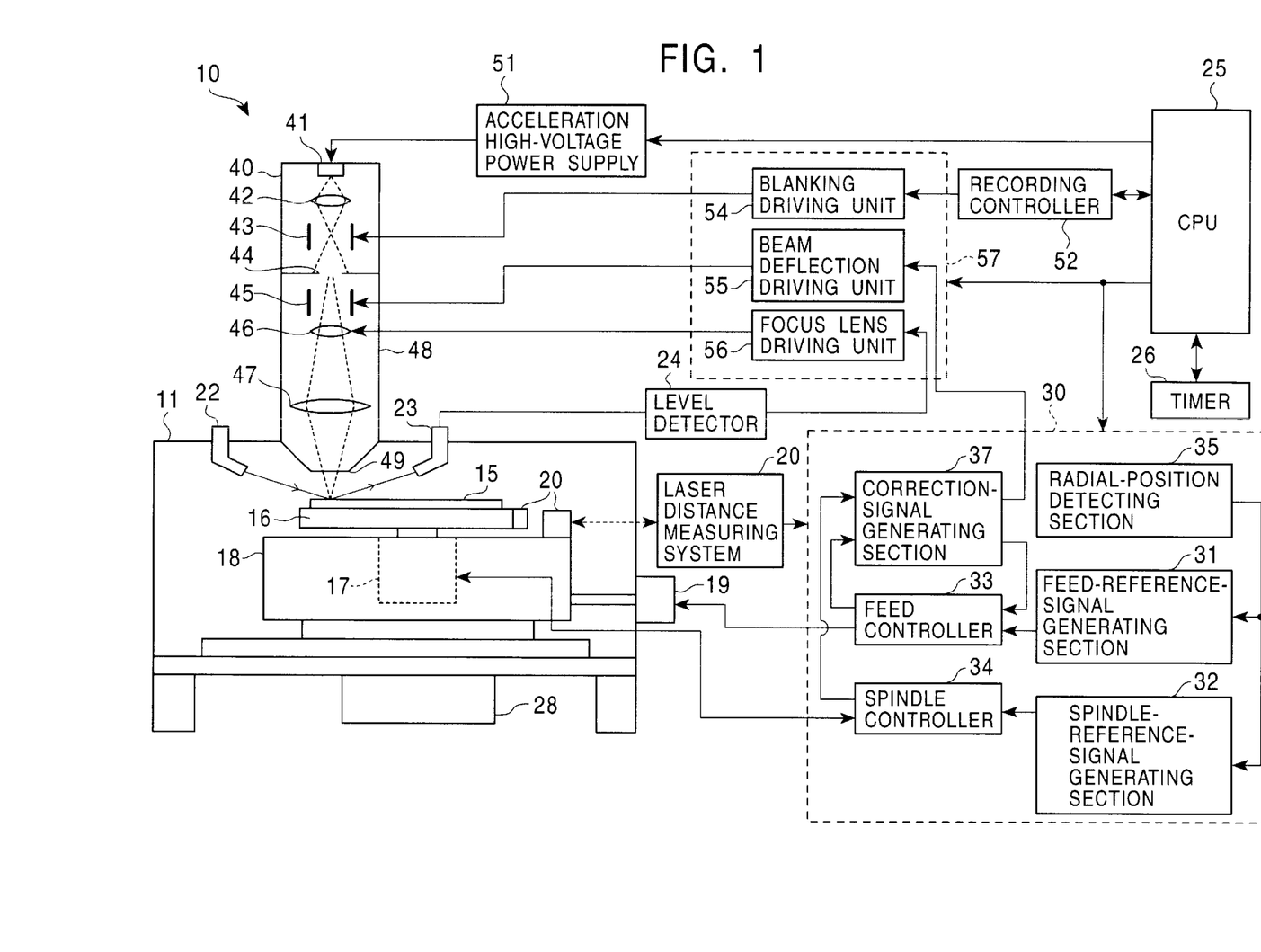
FIG. 1 is a block diagram illustrating a master manufacturing apparatus according to a first embodiment of the present invention, which uses an electron beam.

FIG. 1 is a block diagram illustrating one example of a master manufacturing apparatus according to the first embodiment of the present invention, which uses an electron beam. The outline of the manufacturing process of a master employing an electron beam exposure is described below.

The electron beam exposure is executed in a vacuum environment since the electron beam has such a characteristic as to be attenuated considerably in the atmospheric pressure. Therefore, an electron gun and driving units including a rotating unit and a moving unit for a substrate of the master are used in a vacuum environment. The manufacturing process will be described below for a master of an optical disc as an example.

For manufacturing a master of an optical disc, for example, a silicon (Si) plate is used as a substrate. The silicon substrate is coated with an electron beam resist on the principal or main surface. The substrate coated with the electron beam resist is rotated, and irradiated with an electron beam modulated by an information data signal to spirally or concentrically form a latent image of miniature concave/convex patterns such as pits and grooves in a master manufacturing apparatus 10.

The substrate is removed from the master manufacturing apparatus 10 after the electron beam exposure is terminated, and then is developed. The substrate undergoes a resist patterning and removal processing to form miniature concave/convex patterns on the substrate. The patterned substrate is formed with a conductive film on the principal surface thereof and then undergoes electroforming. Thus, a master of an optical disc is fabricated.

As illustrated in FIG. 1, the master manufacturing apparatus 10 comprises a vacuum chamber 11, a driving unit for driving a substrate placed in the vacuum chamber 11 and an electron beam emitting head 40 mounted on the vacuum chamber 11 which includes an electron beam optical system.

A substrate 15 for an optical disc master is held on a turntable 16. The turntable 16 is rotated about a vertical axis of the principal surface of the substrate by a spindle motor 17, which is a rotation driving device for rotating the substrate 15. The spindle motor 17 is accommodated in a feed stage (hereinafter, simply referred to as "stage") 18. The stage 18 is coupled to a feed motor 19, which is a driving device for a translational motion, or a movement driving unit, and is able to move the spindle motor 17 and the turntable 16 in a predetermined direction in a plane parallel to the principal surface of the substrate 15. Provided on the stage 18 and the turntable 16 are optical elements, such as interferometers and a reflector, which are part of a laser distance measuring system 20 in order to measure a distance using a distance measuring laser beam from a light source in the laser distance measuring system 20. The laser distance measuring system 20 will be described in detail later.

The turntable 16 is made of a dielectric material, for example, ceramic or the like, and is held by an electrostatic chucking mechanism (not shown). The electrostatic chucking mechanism comprises a ceramic substrate and an electrode, which is provided in the ceramic substrate and made of a conductor for causing electrostatic polarization. The electrode is connected with a high-voltage power supply (not shown). As the high-voltage power supply applies a positive DC voltage to the electrodes, electrostatic polarization is caused in the ceramic substrate, providing the chucking force. That is, the application of a DC voltage to the dielectric substance generates the chucking force that chucks the substrate 15.

The vacuum chamber 11 is also provided with a light source 22, a photodetector 23 and a level detector 24 for detecting the level of the principal surface of the substrate 15. The photodetector 23, which includes, for example, a position sensor, CCD (Charge Coupled Device) or the like; receives a light beam emitted from the light source 22 and reflected from the surface of the substrate 15, and supplies a light receiving signal to the level detector 24. The level detector 24 detects the level of the principal surface of the substrate 15 based on the light receiving signal.

The vacuum chamber 11 is installed through a vibration isolator (not shown) such as an air damper to suppress transmission of external vibrations. Also, the vacuum chamber 11 is connected to a vacuum pump 28 which evacuates the vacuum chamber 11 such that the chamber is set in a vacuum atmosphere at a predetermined pressure.

The vacuum chamber 11 is provided with a driving controller 30 which controls rotation and movement driving systems. The driving controller 30 operates under the control of a main controller (CPU) 25 which executes general control of the master manufacturing apparatus 10. The CPU 25 is connected to a counting unit (timer) 26. The driving controller 30 performs drive control based on measured distance data from the laser distance measuring system 20. The driving controller 30 is provided with a radial-position detecting section 35 which detects the radial position of an electron beam spot based on the measured distance data. The driving controller 30 includes a feed-reference-signal generating section 31 which generates a reference signal of the feeding amount of the stage 18 and a spindle-reference-signal generating section 32 which generates a reference signal of the rotation amount of the spindle motor 17. The driving controller 30 further includes a feed controller 33 which generates a feed control signal, and a spindle controller 34 which performs spindle control. The feed controller 33 and the spindle controller 34 perform the control operations based on the reference signals. As will be discussed later, the driving controller 30 is provided with a correction-signal generating section 37 which generates a rotational-fluctuation/feed-error signal and a correction signal for deflection control of an electron beam.

The electron beam emitting head 40 for emitting an electron beam comprises an electron gun 41, a converging lens 42, blanking electrodes 43, an aperture 44, beam deflecting electrodes 45, a focus adjusting lens 46, and an objective lens 47 disposed in this order in the electron beam emitting head 40. The electron beam emitting head 40 includes an electron beam emitting port 49 formed at a leading end of the electron gun cylinder 48, oriented to a space within the vacuum chamber 11. The electron beam emitting head 40 is attached on the ceiling surface of the vacuum chamber 11. The electron beam emitting port 49 is disposed at a location near the substrate 15 to be opposed to the principal surface of the substrate 15 on the turntable 16.

The electron gun 41 emits an electron beam accelerated to, for example, several tens of KeV by a cathode (not shown) which is applied with a high voltage supplied from an acceleration high-voltage power supply 51. The emitted electron beam is converged by the converging lens42 and the converged electron beam is lead to the aperture 44. A blanking driving unit 54 operates based on a signal from a recording controller 52 to control the blanking electrodes 43 for controlling the electron beam between on and off operation. Specifically, the blanking driving unit 54 applies a voltage across the blanking electrodes 43 to greatly deflect the electron beam passing therethrough. In this way, the electron beam is not converged on the iris hole of the aperture 44, i.e., blocked to pass through the aperture 44, so that the electron beam is controlled to be off.

A beam deflection driving unit 55 deflects the electron beam passing through the beam deflecting electrodes 45 by applying the electrodes 45 with a voltage in response to a control signal from the CPU 25. In this way, the position of the electron beam spot is controlled with respect to the substrate 15.

A focus lens driving unit 56 adjusts the focus of the electron beam spot irradiated on the principal surface of the substrate 15 based on a detection signal from the level detector 24.

An electron-beam drive section 57 including the blanking driving unit 54, the beam deflection driving unit 55 and the focus lens driving unit 56, the acceleration high-voltage power supply 51, the laser distance measuring system 20 and the vacuum pump 28 operate based on control signals from the CPU 25.

Figure 2:
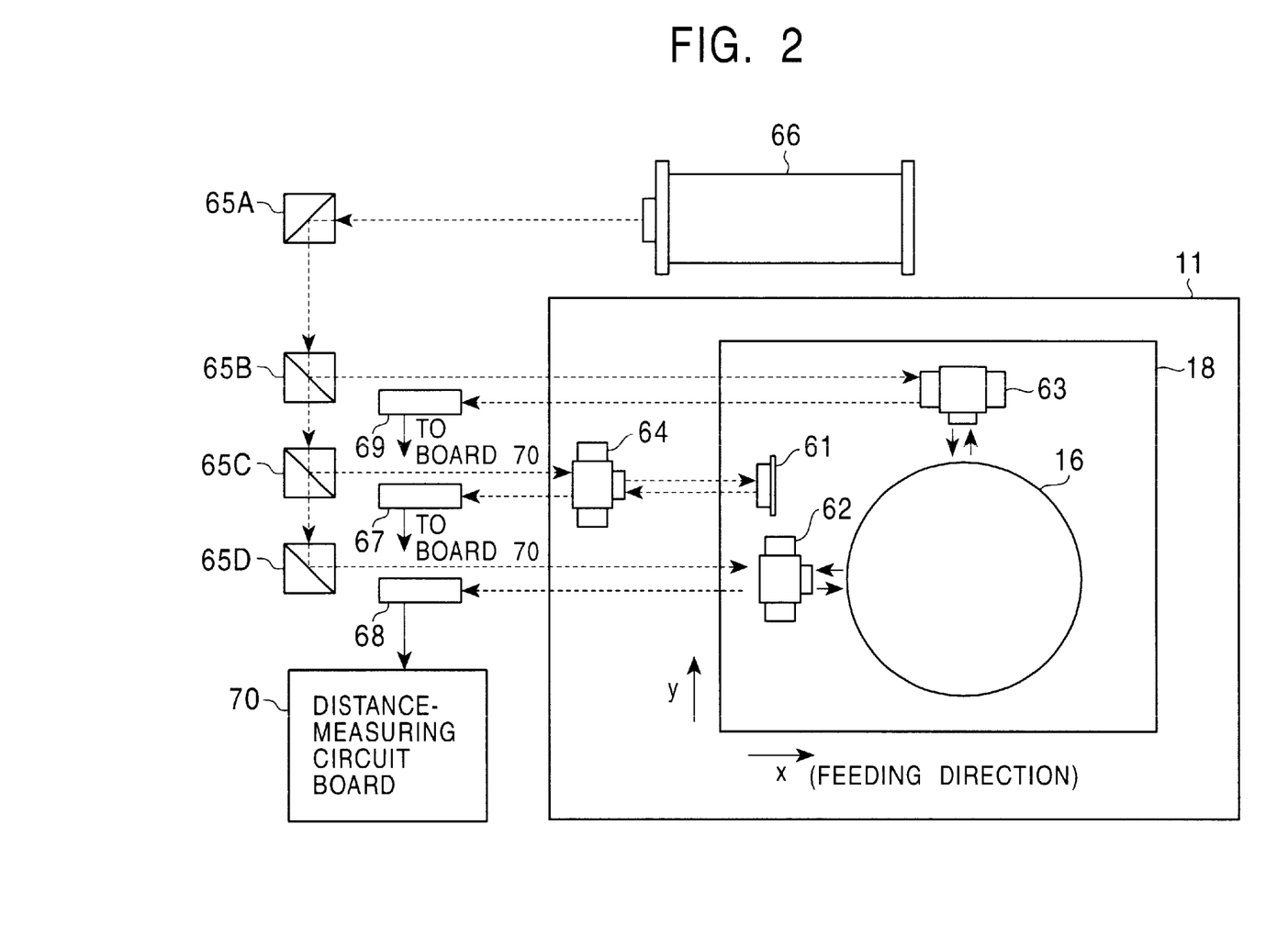
FIG. 2 is a block diagram showing the configuration of a laser distance measuring system of the master manufacturing apparatus shown in FIG. 1.

The laser distance measuring system 20 for detecting the rotational fluctuation of the turntable 16 will now be described in detail. FIG. 2 is a block diagram showing the configuration of the laser distance measuring system 20.

The stage 18 is movable in a predetermined feeding direction (the x-axial direction in FIG. 2) in the vacuum chamber 11. Provided on the stage 18 are a plane reflector 61 and plane-mirror interferometers 62 and 63. A plane-mirror interferometer 64 is mounted outside the stage 18 in the vacuum chamber 11. A laser-beam source 66 for supplying a laser beam to the aforementioned optical elements and beam splitters 65A to 65D are arranged outside the vacuum chamber 11. The interferometers 62, 63 and 64 are supplied with a laser beam via the beam splitters 65D, 65B and 65C, respectively.

The interferometer 62 together with a light receiving unit (receiver) 68 constitutes a first distance measuring unit which detects the rotational fluctuation of the turntable 16 in the x-axial direction. More particularly, the laser beam that is reflected by the turntable 16 is detected by the receiver 68 via the interferometer 62. A detection signal is supplied to a distance-measuring circuit board 70 where x-axial measured distance data which represents the distance between the turntable 16 and the interferometer 62 is generated. The interferometer 63 together with a receiver 69 constitutes a second distance measuring unit which detects the rotational fluctuation of the turntable 16 in a direction orthogonal to the feeding direction of the turntable 16 (the y-axial direction). A detection signal from the receiver 69 is supplied to the distance-measuring circuit board 70 where y-axial measured distance data which represents the distance between the turntable 16 and the interferometer 63 is generated. The interferometer 64 constitutes a third distance measuring unit which detects the amount of movement of the stage 18 together with the plane reflector 61 and a receiver 67. A detection signal from the receiver 67 is supplied to the distance-measuring circuit board 70 where x-axial measured distance data which represents the distance between the stage 18 and the interferometer 64 is generated. This amount of movement represents the x-axial position of the electron beam spot. The above-described optical elements, such as the interferometers, the reflector, the beam splitters and the receiver, are arranged in such a way that the optical paths of the laser beam lie approximately in the same plane.

Individual pieces of measured distance data, which have been generated in the above-described manner in the distance-measuring circuit board 70 based on the detection signals from the receivers 67, 68 and 69, are sent to the correction-signal generating section 37. The correction-signal generating section 37 generates a correction signal for deflection control of the electron beam and sends the correction signal to the beam deflection driving unit 55.

Figure 3:
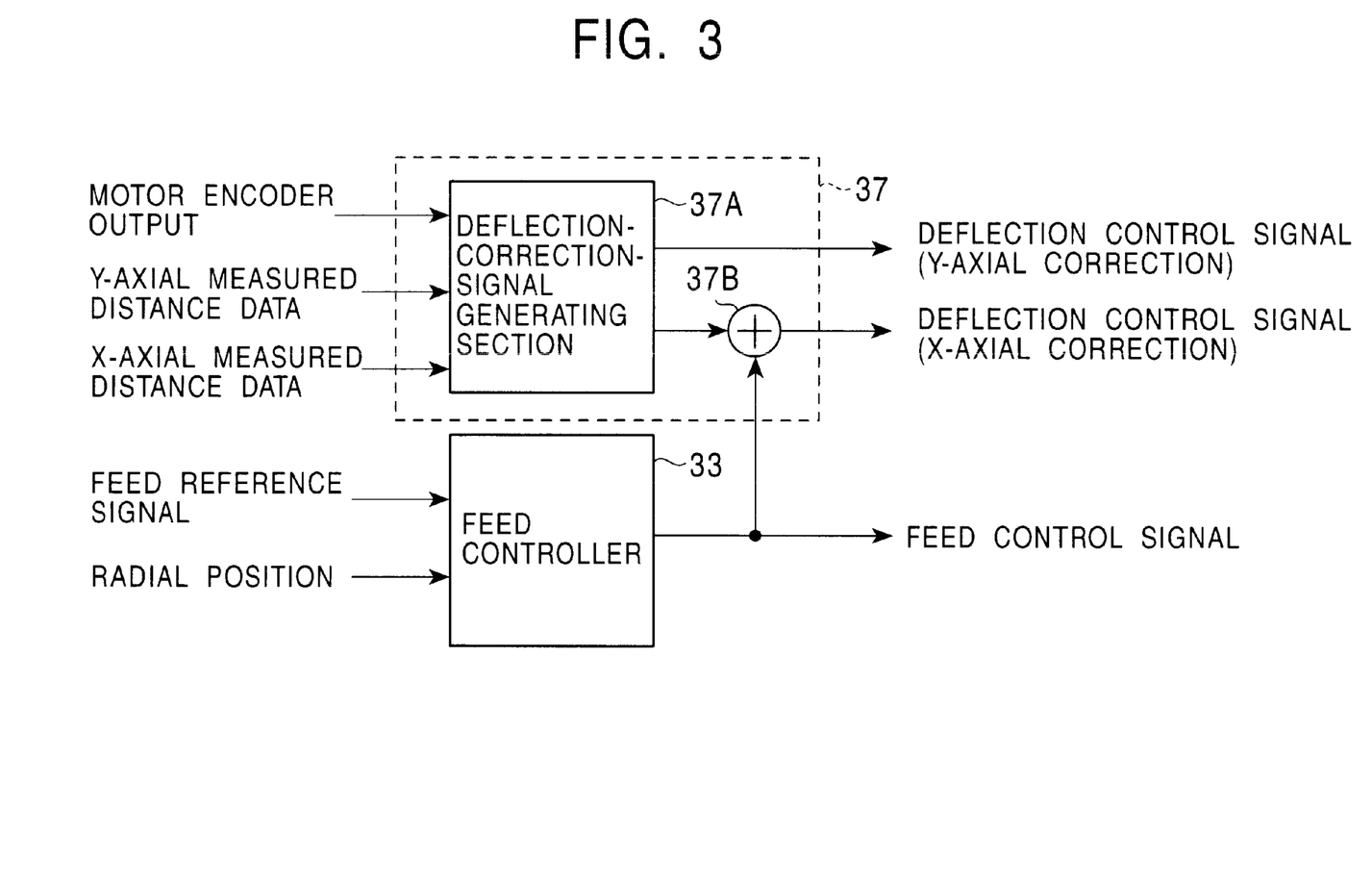
FIG. 3 is a block diagram exemplifying a correction-signal generating section 37 and a feed controller 33.

FIG. 3 is a block diagram exemplifying the correction-signal generating section 37 and the feed controller 33. The correction-signal generating section 37 includes a deflection-correction-signal generating section 37A. The deflection-correction-signal generating section 37A generates a correction signal for correcting the the electron beam deflection using x-axial and y-axial measured distance data from the laser distance measuring system 20. The feed controller 33 generates a feed control signal using a feed reference signal and a radial position signal representing the radial position of the electron beam spot. In a case of CLV (Constant Line Velocity) control, for example, the feed reference signal according to the detected radial position is generated and the feed control signal is generated in such a way that the difference between the feed reference signal and the feed position (i.e., measured distance data from the third distance measuring unit) becomes zero.

Figure 4:
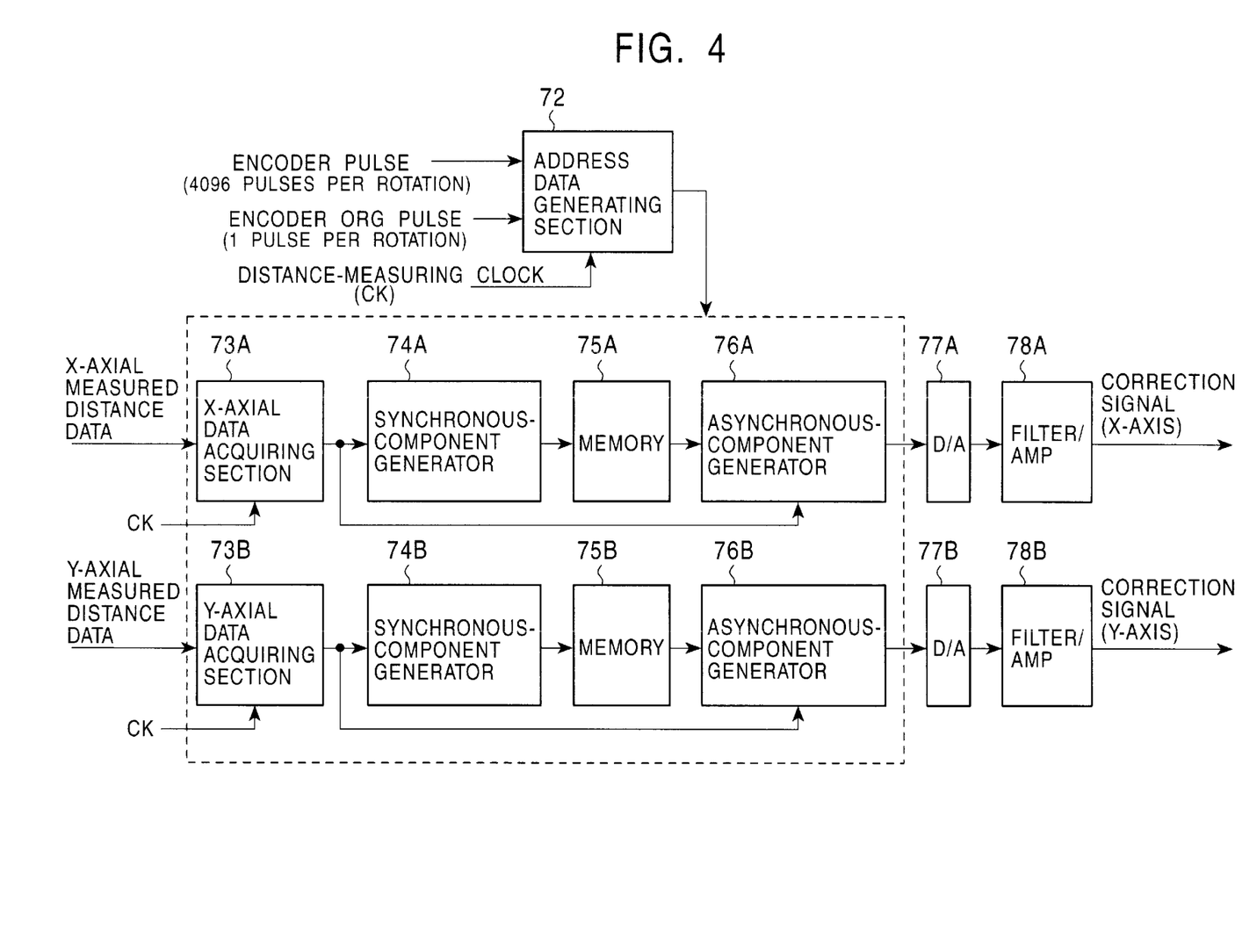
FIG. 4 is a block diagram showing the configuration of a deflection-correction-signal generating section 37A.

FIG. 4 is a block diagram showing the configuration of the deflection-correction-signal generating section 37A. An encoder pulse signal (e.g., 4096 pulses per rotation) indicating the rotational angle of the spindle motor 17, an encoder pulse reference signal (e.g., 1 pulse per rotation) indicating the rotational reference position and a clock signal (CK) from the laser distance measuring system 20 are supplied to an address data generating section 72. The address data generating section 72 counts encoder pulses based on the encoder pulse reference signal. In order to process data every predetermined rotational angle, an address of, for example, 10 bits (=1024) according to the rotational angle is generated from the count value and supplied to individual circuits in the deflection-correction-signal generating section 37A via an address data bus.

The x-axial measured distance data from the laser distance measuring system 20 is fetched by an x-axial data acquiring section 73A. A synchronous-component generator 74A generates a synchronous component of rotational fluctuation (hereinafter, simply referred to as "synchronous component") for every predetermined rotational angle from the acquired measured distance data, and stores the synchronous component in a memory 75A. Addresses according to rotational angles are assigned to the memory 75A. An asynchronous-component generator 76A generates a asynchronous component of rotational fluctuation (hereinafter, also simply referred to as "asynchronous component") using the measured distance data and the stored synchronous component. The asynchronous component is converted into an analog signal in a digital-to-analog (D/A) converter 77A. A filter/amplifier section 78A, which includes a filter of a predetermined-bandwidth and an amplifier, generates an x-axial beam-deflection correction signal. Specifically, the synchronous component in the rotational fluctuation of the turntable 16 is originated from a variation of the side surface, the eccentricity and so forth of the turntable 16, while the asynchronous component is originated from rattling or vibration of the turntable 16. The asynchronous component adversely affects, particularly, the track pitch.

The x-axial beam-deflection correction signal is added to the feed control signal in an adder 37B, and the resultant signal is supplied to the beam deflection driving unit 55. The x-axial beam deflection correction is made for a high-frequency error component, which cannot be followed by the aforementioned feed control, by controlling the x-axial beam deflection. Thus, the beam deflection correction is performed on the high-frequency vibration component and asynchronous component of rotational fluctuation of the stage 18 in the x-axial direction.

With regard to the y-axial measured distance data, similar processes are carried out in a y-axial data acquiring section 73B, a synchronous-component generator 74B, a memory 75B, an asynchronous-component generator 76B, a D/A converter 77B and a filter/amplifier section 78B which includes a filter of a predetermined-bandwidth and an amplifier, thereby generating a y-axial beam-deflection correction signal. The y-axial beam-deflection correction signal is supplied to the bean deflection driving unit 55 to execute beam deflection correction on the y-axial asynchronous component of rotational fluctuation.

Figure 5:
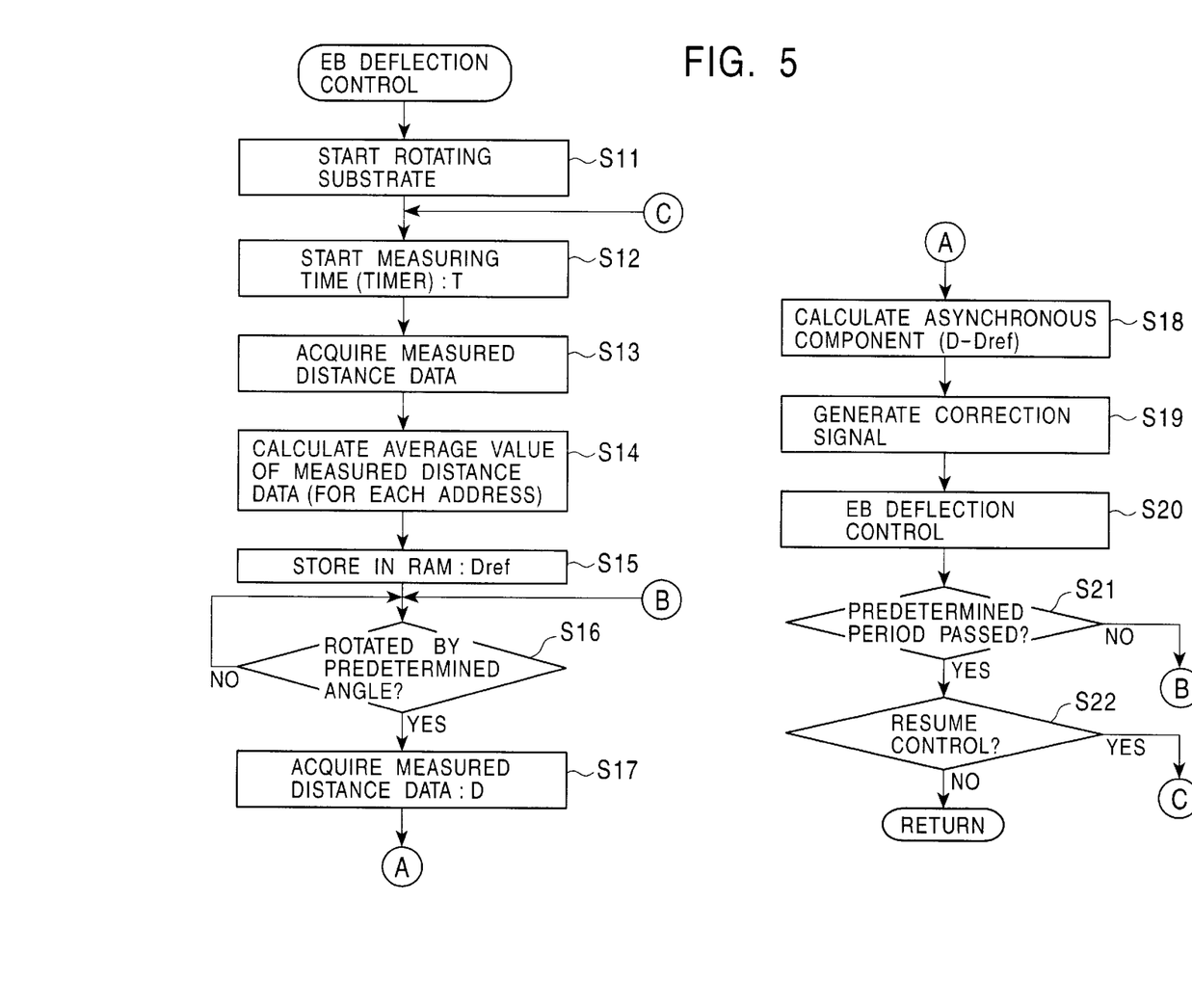
FIG. 5 is a flowchart illustrating a procedure of an electron-beam deflection control operation.

The electron-beam deflection control operation is described in detail below with reference to the flowchart in FIG. 5. The substrate 15 is rotated after the substrate 15 is controlled to be placed at a predetermined position (step S11). Then, the timer 26 starts to measure the time (step S12). Measured distance data (in the x-axial and y-axial directions) is acquired (step S13), and an average value for each address in both directions is calculated (step S14). The calculated value is stored in the associated memory as a synchronous component Dref(x, y) (hereinafter, simply referred to as "Dref") for each address. Then, it is determined whether or not the substrate 15 has turned by a predetermined angle (step S16). When it is determined that the substrate 15 has turned by the predetermined angle, measured distance data D(i) (i=1, 2, . . . ) is acquired (step S17). An asynchronous component is calculated by subtracting a synchronous component Dref(i) stored at an address (i) from the measured distance data D(i) (step S18). Then, each beam-deflection correction signal (x-axial or y-axial) is generated from the asynchronous component in the above-described manner (step S19). The deflection of the electron beam is controlled on the basis of the deflection correction signals (step S20).

It is determined whether or not a predetermined time period has elapsed (step S21). When the predetermined time period has not elapsed yet, control proceeds to step S16 to determine if the substrate 15 has turned by the predetermined angle. In other words, it is determined whether or not the rotation has reached to an angle corresponding to the next address. By repeating steps S16 to S20, therefore, the address-by-address asynchronous component is calculated in real time and deflection control is executed.

When it is determined in step S21 that the predetermined time period has elapsed, it is then determined if deflection control should be continued (step S22). To resume deflection control, control proceeds to step S12 to restarting (resetting) the timer 26 after which steps S13 to S15 are performed to calculate a new synchronous component Dref and store the component in the associated memory. Thus, the synchronous component is updated every predetermined time period. The regular update of the synchronous component can cancel out a time-dependent change in synchronous component caused by thermal expansion or the like.

When it is determined in step S22 that deflection control is not resumed, the control returns to the main routine.

Therefore, the present invention can provide a manufacturing apparatus which can eliminate the adverse influence of the rotational fluctuation of the substrate to manufacture a high-precision optical master. As the distance to be measured is short, stable and reliable correction is possible. Further, it is possible to accurately detect the rotational fluctuation in real time and ensure fast correction through digital signal processing.

Second Embodiment

The following describes a second embodiment of the present invention. The configuration of the master manufacturing apparatus 10 is similar to that of the first embodiment.

Figure 6:
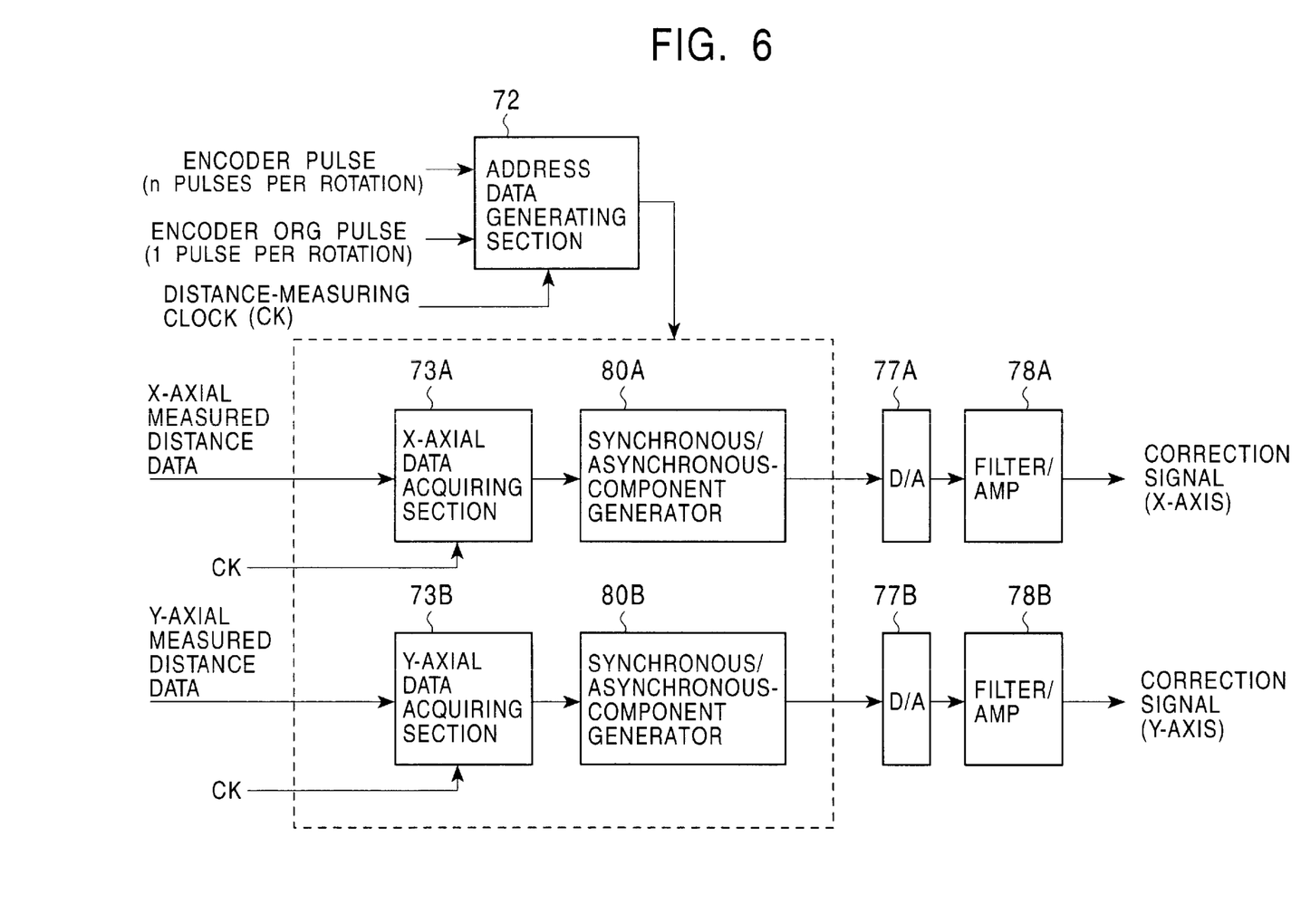
FIG. 6 is a block diagram showing the configuration of a deflection-correction-signal generating section.

FIG. 6 is a block diagram showing the configuration of the deflection-correction-signal generating section 37A. An encoder pulse signal ("n" pulses per rotation; e.g., 4096 pulses per rotation) indicating the rotational angle of the spindle motor 17, an encoder pulse reference signal (e.g., 1 pulse per rotation) indicating the rotational reference position and a clock signal (CK) from the laser distance measuring system 20 are supplied to the address data generating section 72. The address data generating section 72 counts encoder pulses based on the encoder pulse reference signal. For processing data every predetermined rotational angle, an address of, for example, 10 bits (=1024) according to the rotational angle is generated from the count value. The addresses are supplied to individual circuits in the deflection-correction-signal generating section 37A via an address data bus.

The x-axial measured distance data from the laser distance measuring system 20 is fetched into the x-axial data acquiring section 73A where the displacement amount corresponding to the x-axial rotational fluctuation is generated. A synchronous/asynchronous-component generator 80A generates an x-axial synchronous component of rotational fluctuation (hereinafter, simply referred to as "synchronous component") and a asynchronous component of rotational fluctuation (hereinafter, also simply referred to as "asynchronous component"). Specifically, the synchronous component in the rotational fluctuation of the turntable 16 is originated from a variation in the side surface precision, the eccentricity and so forth of the turntable 16, while the asynchronous component is originated from rattling or vibration of the turntable 16. The asynchronous component adversely affects, particularly, the track pitch. The synchronous/asynchronous-component generator 80A will be described in more detail later.

The asynchronous component generated in the synchronous/asynchronous-component generator 80A is converted into an analog signal in the D/A converter 77A. The filter/amplifier section 78A generates an x-axial beam-deflection correction signal.

The x-axial beam-deflection correction signal is added to the feed control signal in an adder 37B, and the resultant signal is supplied to the beam deflection driving unit 55. The x-axial beam deflection correction is made for a high-frequency error component, which cannot be followed by the aforementioned feed control, by controlling the x-axial beam deflection. Thus, the beam deflection correction is performed on the high-frequency vibration component and asynchronous component of rotational fluctuation of the stage 18 in the x-axial direction.

With regard to the y-axial measured distance data, similar processes are carried out in the y-axial data acquiring section 73B, a synchronous/asynchronous-component generator 80B, the D/A converter 77B and the filter/amplifier section 78B, thereby generating a y-axial beam-deflection correction signal. The y-axial beam-deflection correction signal is supplied to the beam deflection driving unit 55 to execute beam deflection correction on the y-axial asynchronous component of rotational fluctuation.

Figure 7:
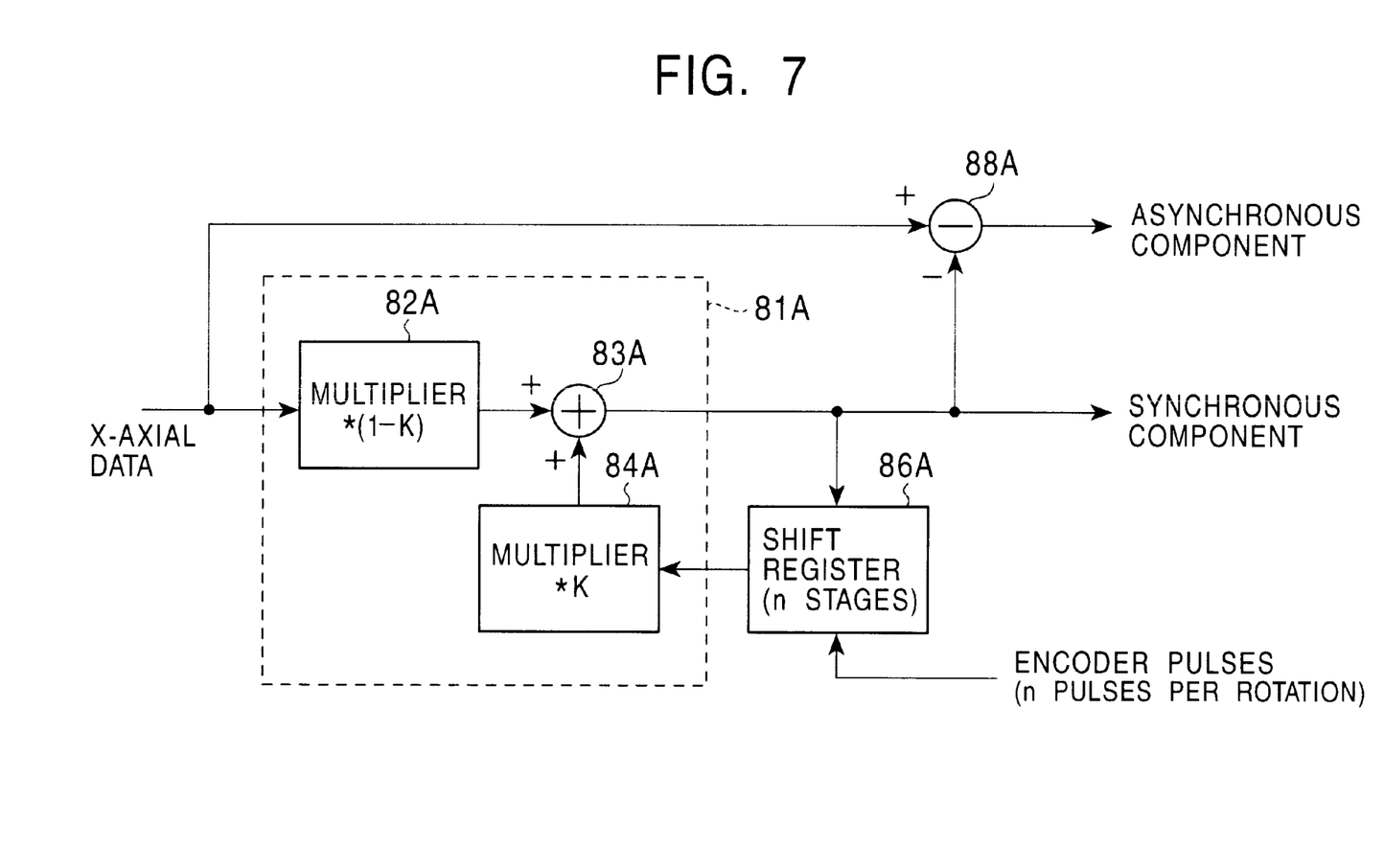
FIG. 7 is a block diagram exemplifying the configuration of a synchronous/asynchronous-component generating section.

FIG. 7 is a block diagram exemplifying the configuration of the synchronous/asynchronous-component generator 80A. The x-axial displacement amount (i.e., the current or present amount of displacement) supplied from the x-axial data acquiring section 73A is supplied to a weighted-mean calculating section 81A. The weighted-mean calculating section 81A calculates a weighted mean value (weighted average value) of the current displacement amount and an accumulated displacement amount, thereby yielding a new accumulated displacement amount. The new accumulated displacement amount is used as a synchronous component of rotational fluctuation.

The calculation is specifically described below. The accumulated displacement amount from the weighted-mean calculating section 81A is delayed by one rotation of the turntable 16 (i.e., the substrate 15) by a delay unit, such as a shift register 86A and is then supplied to the weighted-mean calculating section 81A as the accumulated displacement amount. The n-stage shift register 86A, to which the aforementioned encoder pulse signal (n pulses per rotation) is supplied, supplies the weighted-mean calculating section 81A with the previous weighted mean value in response to the pulse signal. The previous weighted mean value is multiplied by a predetermined coefficient (K) in a multiplier 84A. Meanwhile, the current displacement amount supplied from the x-axial data acquiring section 73A is multiplied by a coefficient (1−K) in the multiplier 82A. The multiplication results are added by an adder 83A to perform a weighted mean operation on the current displacement amount and the accumulated displacement amount, thus yielding a new accumulated displacement amount (i.e., synchronous component). It should be noted that an arithmetic mean is obtained in the weighted-mean calculating section 81A when the predetermined coefficient is set to 0.5 (K=0.5).

As described above, the new accumulated displacement amount represents a synchronous component. The synchronous component is subtracted from the current displacement amount in a subtracter 88A, thus yielding an asynchronous component.

As shown in FIG. 6, similar processing is performed on the y-axial measured distance data to provide a beam-deflection correction signal with respect to the y-axial asynchronous component.

Figure 8:
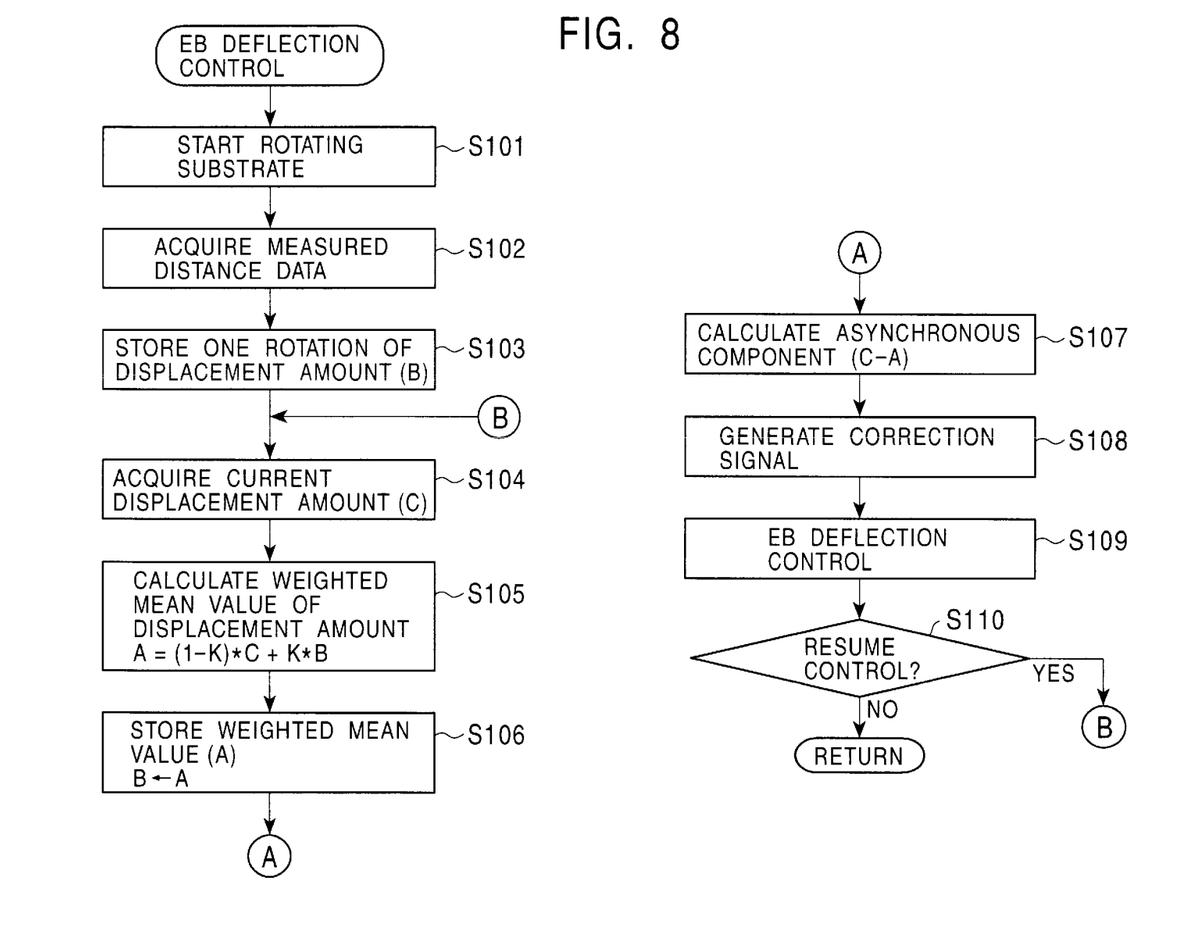
FIG. 8 is a flowchart illustrating a procedure of an electron-beam deflection control operation.

The electron-beam deflection control operation of the second embodiment is described in detail below with reference to the flowchart in FIG. 8. For simplicity of description, x-axial beam deflection control is discussed below.

The substrate 15 is rotated (step S101) after the substrate 15 is placed at a predetermined position. The x-axial measured distance data is acquired based on the encoder pulse reference signal that indicates the reference position of rotation (step S102). One rotation of displacement data B (=B(i); i=1, 2, . . . ) in the x-axial direction is stored in the shift register 86A based on the encoder pulse signal (step S103). Then, displacement data C (=C(i); i=1, 2, . . . ) for the next one rotation is acquired. That is, data of the current or present displacement amount is acquired (step S104).

Then, A=(1−K)×C+K×B is calculated to obtain a weighted mean value A (=A(i); i=1, 2, . . . ) of the displacement amount (step S105) and the calculated weighted mean value A is sequentially stored in the shift register 86A (step S106). The calculated weighted mean value A represents a synchronous component and is used as accumulated displacement amount data (i.e., B) for performing a weighted mean operation on the next one rotation of displacement data C. The weighted mean value A is subtracted from the data of the current displacement amount, yielding an asynchronous component (C−A) (step S107). The beam-deflection correction signal is generated from the asynchronous component (step S108), and deflection control of the electron beam is carried out on the basis of the deflection correction signal (step S109).

Then, it is determined whether or not deflection control should be resumed (step S110). To resume deflection control, control proceeds to step S104 to repeat the sequence of the above-described procedure. When it is determined in step S110 that deflection control is not resumed, the control returns to the main routine.

Similar processing is performed for the y-axial beam deflection control. Through the above-described procedure, deflection control of the electron beam is executed.

According to the present invention, a control error can be suppressed and a high-precision manufacturing apparatus can be provided, since the synchronous component is updated every rotation therefore. It is also possible to provide a high-precision master manufacturing apparatus that requires a smaller memory capacity and takes a simple, configuration to be able to correct the rotational fluctuation of the substrate in real time.

While the foregoing embodiment has been described for a master manufacturing apparatus of an optical disc as an example, the present invention is not limited to the apparatus but can be applied to an apparatus for manufacturing a magnetic disc or the like.

Therefore, the present invention can provide an apparatus which can eliminate the adverse influence of the rotational fluctuation, displacement or the like of the substrate to manufacture a high-density and high-precision master disc.

The invention has been described with reference to the preferred embodiments thereof. It should be understood by those skilled in the art that a variety of alterations and modifications may be made from the embodiments described above. It is therefore contemplated that the appended claims encompass all such alterations and modifications.

This application is based on Japanese Patent Applications No.2000-280305 and No.2001-226300 which are hereby incorporated by reference.

What is claimed is:

1. An apparatus for manufacturing a master by irradiation of an electron beam on a substrate mounted on a turntable, comprising:

an electron-beam emitting section for emitting said electron beam;

a focus control section for converging said electron beam on a principal surface of said substrate;

a rotation drive section for rotating said turntable;

a movement drive section for relatively moving said electron-beam emitting section and said turntable in a predetermined direction in a plane parallel to said principal surface;

a first correction-signal generating section for detecting a first asynchronous component of rotational fluctuation of said turntable in said predetermined direction to generate a first correction signal;

a second correction-signal generating section for detecting a second asynchronous component of rotational fluctuation of said turntable in a direction perpendicular to said predetermined direction to generate a second correction signal; and a deflection control section for performing deflection control on said electron beam on the basis of said first correction signal and said second correction signal.

2. An apparatus according to claim 1, wherein said first correction-signal generating section includes a first distance measuring unit for measuring a displacement of said turntable in said predetermined direction at a time said turntable is rotated and a first asynchronous-component detecting section for detecting said first asynchronous component of rotational fluctuation on the basis of measured distances each measured every predetermined rotational angle by said first distance measuring unit and an average value of the measured distances; and said second correction-signal generating section includes a second distance measuring unit for measuring a displacement of said turntable in a direction perpendicular to said predetermined direction and a second asynchronous-component detecting section for detecting said second asynchronous component of rotational fluctuation on the basis of measured distances each measured every predetermined rotational angle by said second distance measuring unit and an average value of the measured distances.

3. An apparatus according to claim 2, wherein said first asynchronous-component detecting section and said second asynchronous-component detecting section respectively detect said first asynchronous component of rotational fluctuation and said second asynchronous component of rotational fluctuation every predetermined period.

4. An apparatus for manufacturing a master by irradiation of an electron beam on a substrate, comprising:

an electron-beam emitting section for emitting said electron beam;

a deflection drive section for performing deflection control on said electron beam;

a rotation drive section for rotating said substrate;

a movement drive section for relatively moving said electron-beam emitting section and said substrate in a predetermined direction in a plane parallel to a principal surface of said substrate;

a distance measuring section for measuring an displacement amount of said substrate in said predetermined direction when said substrate is rotated;

an asynchronous-component generating section for calculating a weighted mean value of a current displacement amount measured by said distance measuring section and an accumulated displacement amount and for subtracting the calculated weighted mean value from the measured current displacement amount to generate an asynchronous component, said accumulated displacement amount being a previous weighted mean value for one rotation of said substrate; and a control section for controlling said deflection drive section based on a magnitude of said asynchronous component to thereby adjust an irradiation position of said electron beam.

5. An apparatus according to claim 4, wherein said distance measuring section measures said displacement amount every predetermined rotational angle of said substrate and said asynchronous-component generating section generates said asynchronous component every said predetermined rotational angle.

6. An apparatus according to claim 4, wherein said asynchronous-component generating section includes:

a weighted mean calculating circuit for calculating a weighted mean value of a current displacement amount measured by said distance measuring section and an accumulated displacement amount;

a delay circuit for delaying said weighted mean value by one rotation of said substrate and outputting the delayed weighted mean value as said accumulated displacement amount; and a subtraction circuit for subtracting said weighted mean value from said current displacement amount to thereby generate said asynchronous component.

7. An apparatus according to claim 4, wherein said distance measuring section comprises a first distance measuring unit for measuring a displacement of said substrate in said predetermined direction and a second distance measuring unit for measuring a displacement of said substrate in a direction perpendicular to said predetermined direction; and said asynchronous-component generating section generates an asynchronous component in said predetermined direction on the basis of the displacement amount measured by said first distance measuring unit and generates an asynchronous component in said direction perpendicular to said predetermined direction on the basis of the displacement amount measured by said second distance measuring unit.

* * * * *